United States Patent
Sato

(10) Patent No.: US 7,539,033 B2
(45) Date of Patent: May 26, 2009

(54) SEMICONDUCTOR MEMORY DEVICE

(75) Inventor: Hajime Sato, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 17 days.

(21) Appl. No.: 11/935,931

(22) Filed: Nov. 6, 2007

(65) Prior Publication Data

US 2008/0117659 A1 May 22, 2008

(30) Foreign Application Priority Data

Nov. 21, 2006  (JP) .............................. 2006-313692

(51) Int. Cl.
*G11C 5/02* (2006.01)
(52) U.S. Cl. ..................... 365/51; 365/63; 365/189.03
(58) Field of Classification Search .................... 365/51, 365/63, 189.03, 189.07, 233, 236, 230.06, 365/230.03, 208
See application file for complete search history.

(56) References Cited

U.S. PATENT DOCUMENTS

| | | | |
|---|---|---|---|
| 6,317,377 B1 | 11/2001 | Kobayashi | |
| 2003/0112682 A1* | 6/2003 | Sekiguchi et al. | ........... 365/205 |
| 2005/0157827 A1 | 7/2005 | Yoon et al. | |
| 2007/0183239 A1* | 8/2007 | Kishi | .......................... 365/208 |

FOREIGN PATENT DOCUMENTS

| JP | 2000-298981 A | 10/2000 |
|---|---|---|
| JP | 2005-209333 A | 8/2005 |

OTHER PUBLICATIONS

Chih Tseng et al., "A 72Mb Separate-I/O Synchronous SRAM Chip with 504Gb/s Data Bandwidth", ISSCC 2006/Session 32/SRAM/34. 3, 2006 IEEE International Solid-State Circuits Conference, pp. 626-628.

* cited by examiner

*Primary Examiner*—Dang T Nguyen
(74) *Attorney, Agent, or Firm*—Miles & Stockbridge P.C.

(57) ABSTRACT

There is provided a semiconductor memory device which offers enhanced speed in burst mode. The semiconductor memory device has a burst mode for serially reading multiple bits of data in a fixed order in synchronization with both edges of a clock. Multiple memory blocks are geometrically arranged correspondingly to the multiple bits. An address selection circuit selects a memory cell from the memory blocks. Data read from the memory blocks is parallel transmitted to an output circuit. The output circuit first outputs data from a memory block to which data is transmitted fastest among the multiple memory blocks. The output circuit serially outputs data in the fixed order in synchronization with both edges of the clock.

10 Claims, 14 Drawing Sheets

FIG. 16

| | | | | | | | | |
|---|---|---|---|---|---|---|---|---|
| MAT0 | DQ0 (B0) | DQ0 (B0) | DQ0 (B1) | DQ0 (B1) | DQ0 (B0) | DQ0 (B0) | DQ0 (B1) | DQ0 (B1) |
| | DQ1 (B0) | DQ1 (B0) | DQ1 (B1) | DQ1 (B1) | DQ1 (B0) | DQ1 (B0) | DQ1 (B1) | DQ1 (B1) |
| | DQ2 (B0) | DQ2 (B0) | DQ2 (B1) | DQ2 (B1) | DQ2 (B0) | DQ2 (B0) | DQ2 (B1) | DQ2 (B1) |
| | DQ3 (B0) | DQ3 (B0) | DQ3 (B1) | DQ3 (B1) | DQ3 (B0) | DQ3 (B0) | DQ3 (B1) | DQ3 (B1) |
| | DQ4 (B0) | DQ4 (B0) | DQ4 (B1) | DQ4 (B1) | DQ4 (B0) | DQ4 (B0) | DQ4 (B1) | DQ4 (B1) |
| | DQ5 (B0) | DQ5 (B0) | DQ5 (B1) | DQ5 (B1) | DQ5 (B0) | DQ5 (B0) | DQ5 (B1) | DQ5 (B1) |
| | DQ6 (B0) | DQ6 (B0) | DQ6 (B1) | DQ6 (B1) | DQ6 (B0) | DQ6 (B0) | DQ6 (B1) | DQ6 (B1) |
| | DQ7 (B0) | DQ7 (B0) | DQ7 (B1) | DQ7 (B1) | DQ7 (B0) | DQ7 (B0) | DQ7 (B1) | DQ7 (B1) |
| | DQ8 (B0) | DQ8 (B0) | DQ8 (B1) | DQ8 (B1) | DQ8 (B0) | DQ8 (B0) | DQ8 (B1) | DQ8 (B1) |
| | SWD | SWD | SWD | SWD | SWD | SWD | SWD | SWD |
| MAT1 | DQ0 (B0) | DQ0 (B0) | DQ0 (B1) | DQ0 (B1) | DQ0 (B0) | DQ0 (B0) | DQ0 (B1) | DQ0 (B1) |
| | DQ1 (B0) | DQ1 (B0) | DQ1 (B1) | DQ1 (B1) | DQ1 (B0) | DQ1 (B0) | DQ1 (B1) | DQ1 (B1) |
| | DQ2 (B0) | DQ2 (B0) | DQ2 (B1) | DQ2 (B1) | DQ2 (B0) | DQ2 (B0) | DQ2 (B1) | DQ2 (B1) |
| | DQ3 (B0) | DQ3 (B0) | DQ3 (B1) | DQ3 (B1) | DQ3 (B0) | DQ3 (B0) | DQ3 (B1) | DQ3 (B1) |
| | DQ4 (B0) | DQ4 (B0) | DQ4 (B1) | DQ4 (B1) | DQ4 (B0) | DQ4 (B0) | DQ4 (B1) | DQ4 (B1) |
| | DQ5 (B0) | DQ5 (B0) | DQ5 (B1) | DQ5 (B1) | DQ5 (B0) | DQ5 (B0) | DQ5 (B1) | DQ5 (B1) |
| | DQ6 (B0) | DQ6 (B0) | DQ6 (B1) | DQ6 (B1) | DQ6 (B0) | DQ6 (B0) | DQ6 (B1) | DQ6 (B1) |
| | DQ7 (B0) | DQ7 (B0) | DQ7 (B1) | DQ7 (B1) | DQ7 (B0) | DQ7 (B0) | DQ7 (B1) | DQ7 (B1) |
| | DQ8 (B0) | DQ8 (B0) | DQ8 (B1) | DQ8 (B1) | DQ8 (B0) | DQ8 (B0) | DQ8 (B1) | DQ8 (B1) |

DATA BUS LOGIC REGION

SEMICONDUCTOR MEMORY DEVICE

CROSS-REFERENCE TO RELATED APPLICATIONS

The disclosure of Japanese Patent Application No. 2006-313692 filed on Nov. 21, 2006 including the specification, drawings and abstract is incorporated herein by reference in its entirety.

BACKGROUND OF THE INVENTION

The present invention relates to a semiconductor memory device, and in particular, relates to a technology effective when used for a static RAM having a burst mode.

Japanese Unexamined Patent Publication No. 2005-209333 concerns DDR (Double Data Rate) SRAM. The technology described in this publication relates to data input operations in CC mode. Japanese Unexamined Patent Publication No. 2000-298981 provides an example of DRAM that parallel reads multiple bits and serially outputs them for acceleration. A synchronous SRAM is described in 2006 IEEE DIGEST OF TECHNICAL PAPERS pp. 626-628.

[Patent document 1] Japanese Unexamined Patent Publication No. 2005-209333

[Patent document 2] Japanese Unexamined Patent Publication No. 2000-298981

[Non-patent document 1] 2006 IEEE DIGEST OF TECHNICAL PAPERS pp. 626-628

SUMMARY OF THE INVENTION

FIG. 15 is an overall block diagram of an SRAM which was studied prior to the present invention. In FIG. 15, a semiconductor chip is vertically long. The semiconductor chip is divided into four areas by an input/output circuit region which is vertically provided in a horizontal center portion and an indirect logic region which is horizontally provided in a vertical center portion. A memory cell array is formed in each of the four areas. The memory cell array provided in one area is vertically divided into two main parts, and each of the two parts is horizontally divided into eight blocks.

The one memory cell array is vertically divided into 16 mats. Therefore, eight mats are provided in each of the two main parts. FIG. 16 is an enlarged view of two mats out of the eight mats. In FIG. 16, word line selection circuits SWD are disposed between two adjacent mats MAT0 and MAT1. One mat MAT0 (MAT1) is divided into nine blocks, each having a corresponding input/output circuit (DQ0 to 8) and burst sequences (B0) and (B1). For access to the SRAM, two shaded memory blocks corresponding to (B0) and (B1) in one of the two memory mats MAT0 and MAT1 are selected. In the entire chip of FIG. 15, memory access is performed to respective two shaded memory blocks in the memory cell arrays of the four areas.

In the burst mode of the SRAM, the operation speed is limited by the slowest data among all data (two or four pieces of data) processed in one write or read operation. In FIG. 15, memory cell selection paths, data output paths, and delay times are illustrated. In two memory cell arrays on the left side as an example out of the four memory cell arrays, signal transmission paths are illustrated by bold solid lines and arrows. An address signal is inputted based on a clock supplied from clock CK. Memory cells in the respective nine memory blocks of the two memory blocks (B0) and (B1) are selected in parallel by address selection circuits such as decoders provided in the indirect logic region.

Signals read from memory cells are transmitted through respective transmission paths to a signal line (bus) provided in a middle region vertically dividing the area into two, and led to the vertical center portion. Signals that are read from the memory cells disposed at the upper and lower ends of memory blocks and pass through signal lines having a length corresponding to eight mats in the vertical direction to a data bus logic region in the center portion have the largest signal delay. Similarly, in write paths as well, signals pass along the data bus logic region through signal lines having the length corresponding to eight mats to the memory cells disposed at the upper and lower ends of memory blocks. Address allocation shown in FIG. 15 is also performed in the SRAM described in Non-patent document 1.

In the development of an SRAM operating at high speed and with multi-pin input/output circuits, since the MAT (or word driver) and I/O allocation shown in FIG. 15 makes data buses longer, a signal delay and a large skew due to the different lengths of data buses between accessed memory cells become a problem, thus making it difficult to accelerate the cycle. For example, in FIG. 16, the data bus length of DQ0 is different from that of DQ8 by one mat length, thereby causing a skew. Thus, the configuration shown in FIG. 15 makes it difficult to achieve a fast memory cycle exceeding approximately 650 MHz in a semiconductor circuit formed by fine-line technology with a line width of 90 nm.

It is an object of the present invention to provide a semiconductor memory device, having a burst mode, which offers enhanced speed while suppressing increase in power consumption. These and other objects and new features of the invention will become more apparent upon a reading of the following detailed description and drawing of this specification.

According to one aspect of the invention, a first input/output circuit and a second input/output circuit including a pad corresponding to an external terminal are disposed adjacent to each other in a first direction of a semiconductor chip. A first memory mat and a second memory mat which correspond to the first and second input/output circuits are disposed in a second direction perpendicular to the first direction. A word line selection circuit which generates a signal for selecting a word line common to the first memory mat and the second memory mat is disposed between the first memory mat and the second memory mat. The first memory mat and the second memory mat each include first to fourth memory blocks having a common word line selected by the word line selection circuit. Memory cells in the first and second memory blocks can be accessed, including a burst operation, by the first input/output circuit. Memory cells in the third and fourth memory blocks can be accessed, including a burst operation, by the second input/output circuit.

With the selection of one word line, memory cells accessed in burst mode can be selected simultaneously, thus suppressing increase in power consumption. Between input/output circuits and memory cells, a line path in the first direction can be so short as to be the width of one memory mat and the mutual signal delay between two bits can be reduced, thus offering enhanced speed.

BRIEF DESCRIPTION OF THE DRAWINGS

FIG. 16 is an enlarged view of two mats in FIG. 15.

DESCRIPTION OF THE PREFERRED EMBODIMENTS

Figure 1:
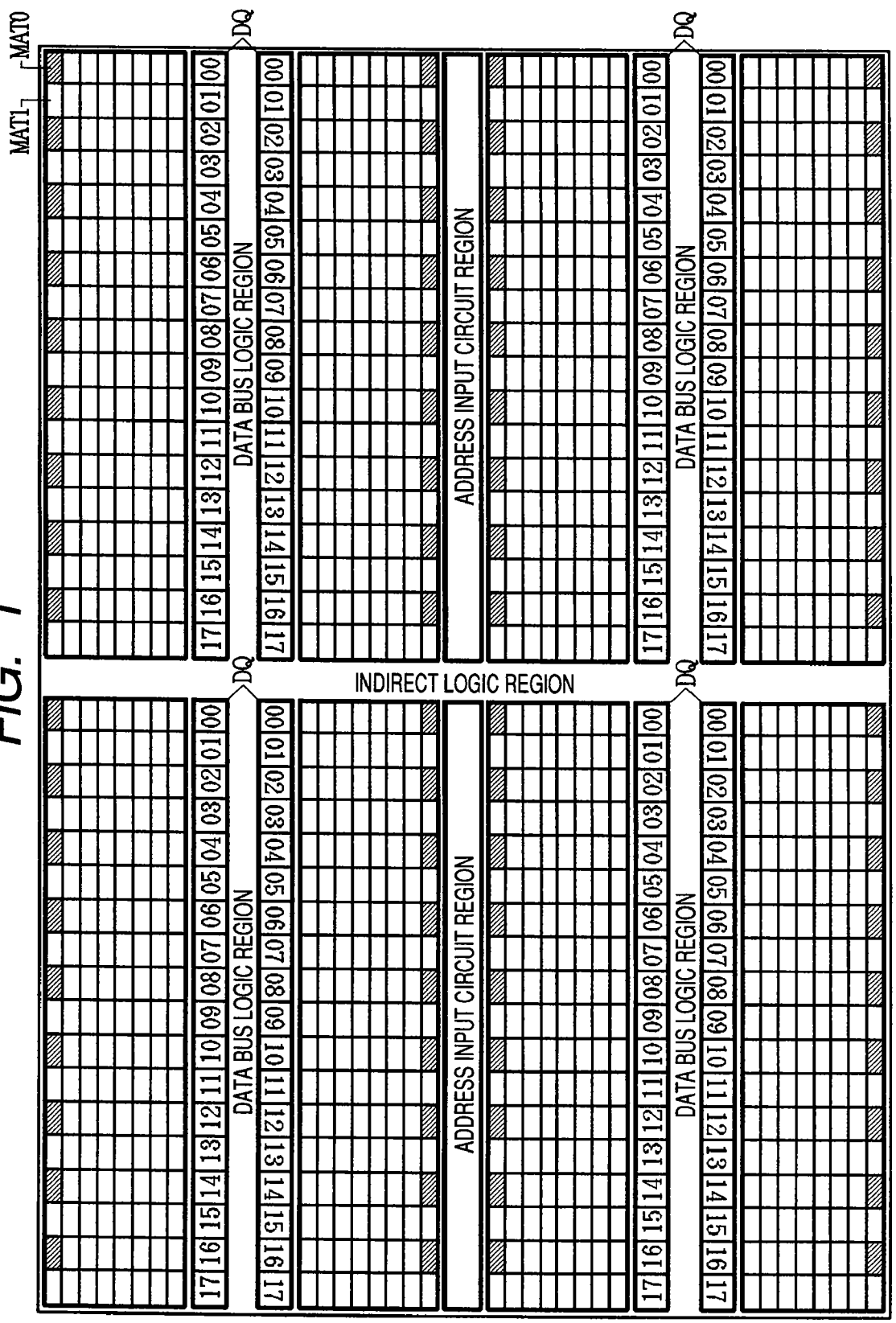
FIG. 1 is an overall block diagram of an SRAM according to an embodiment of the present invention.

FIG. 1 is an overall block diagram of an SRAM according to an embodiment of the present invention. In FIG. 1, the arrangement of blocks corresponds to the geometric arrangement on an actual semiconductor chip. As shown in FIG. 1, the semiconductor chip is divided into four areas by an address input circuit region which is vertically provided in a horizontal center portion and an indirect logic region which is horizontally provided in a vertical center portion. The four areas each include memory cell arrays and a data bus logic region.

Figure 2:
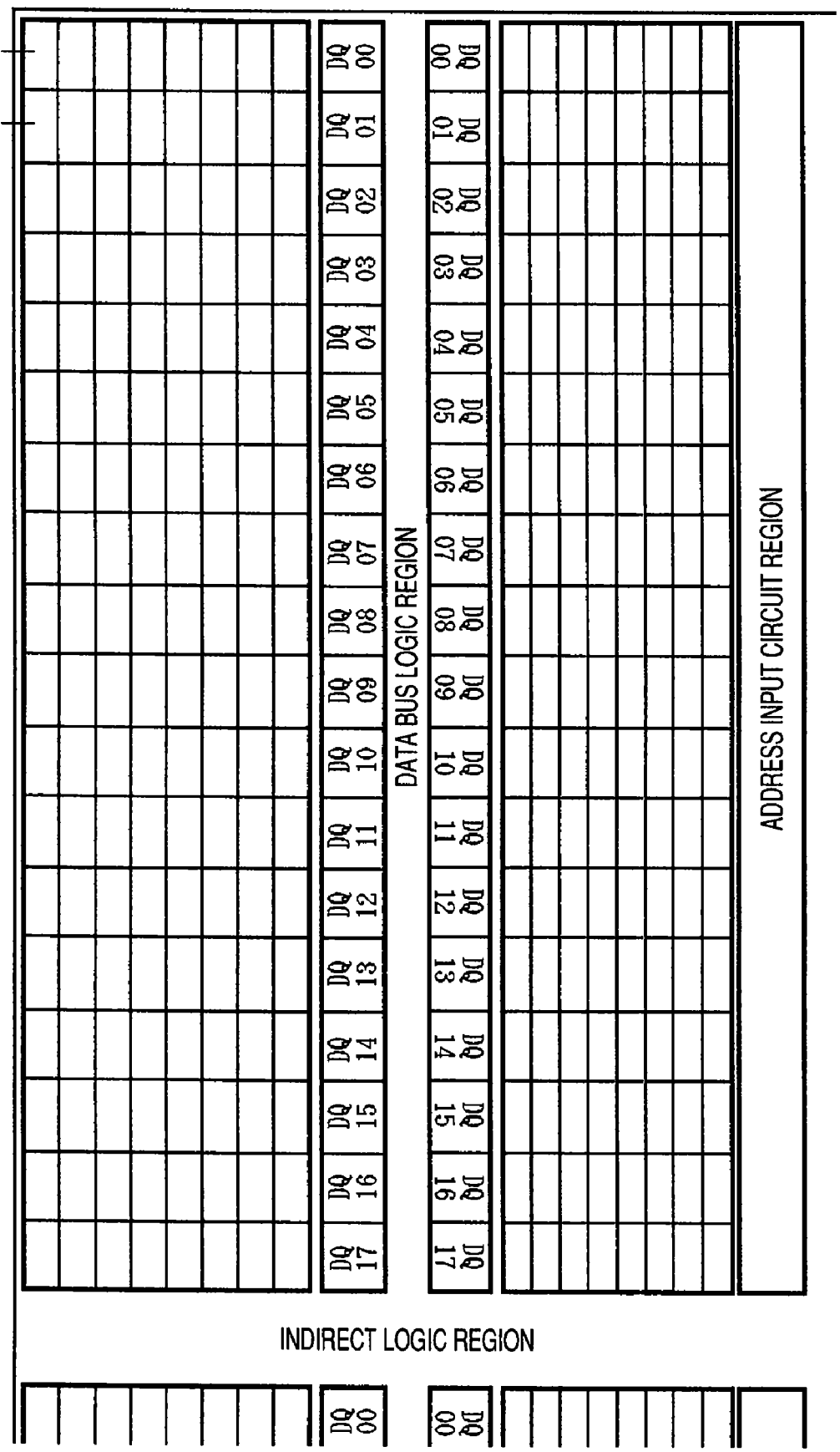
FIG. 2 is an enlarged view showing a memory cell array and a data bus logic region in one area.

FIG. 2 is an enlarged view showing memory cell arrays and a data bus logic region in one area. In one area, memory cell arrays and corresponding input/output circuits DQ00 to DQ17 are disposed symmetrically so as to interpose the data bus logic region which is vertically provided in a horizontal center portion. As a feature of this embodiment, there are disposed memory mats MAT0 and MAt1 corresponding to the input/output circuits DQ00 to DQ01, illustrated by way of example in FIG. 2. Similar memory mats are disposed corresponding to the remaining input/output circuits DQ02 to DQ17. That is, the circuit is laid out such that the width of the input/output circuits DQ00 coincides with the width of the memory mat MAT0. The same relationship is established between the other input/output circuits DQ02 to DQ17 and the corresponding memory mats. Address allocation including burst mode is performed on a set of the input/output circuits DQ00 and DQ1 and the memory mats MAT0 and MAT1. The same relationship is established between the other input/output circuits DQ02 to DQ17 and the corresponding memory mats.

Figure 3:
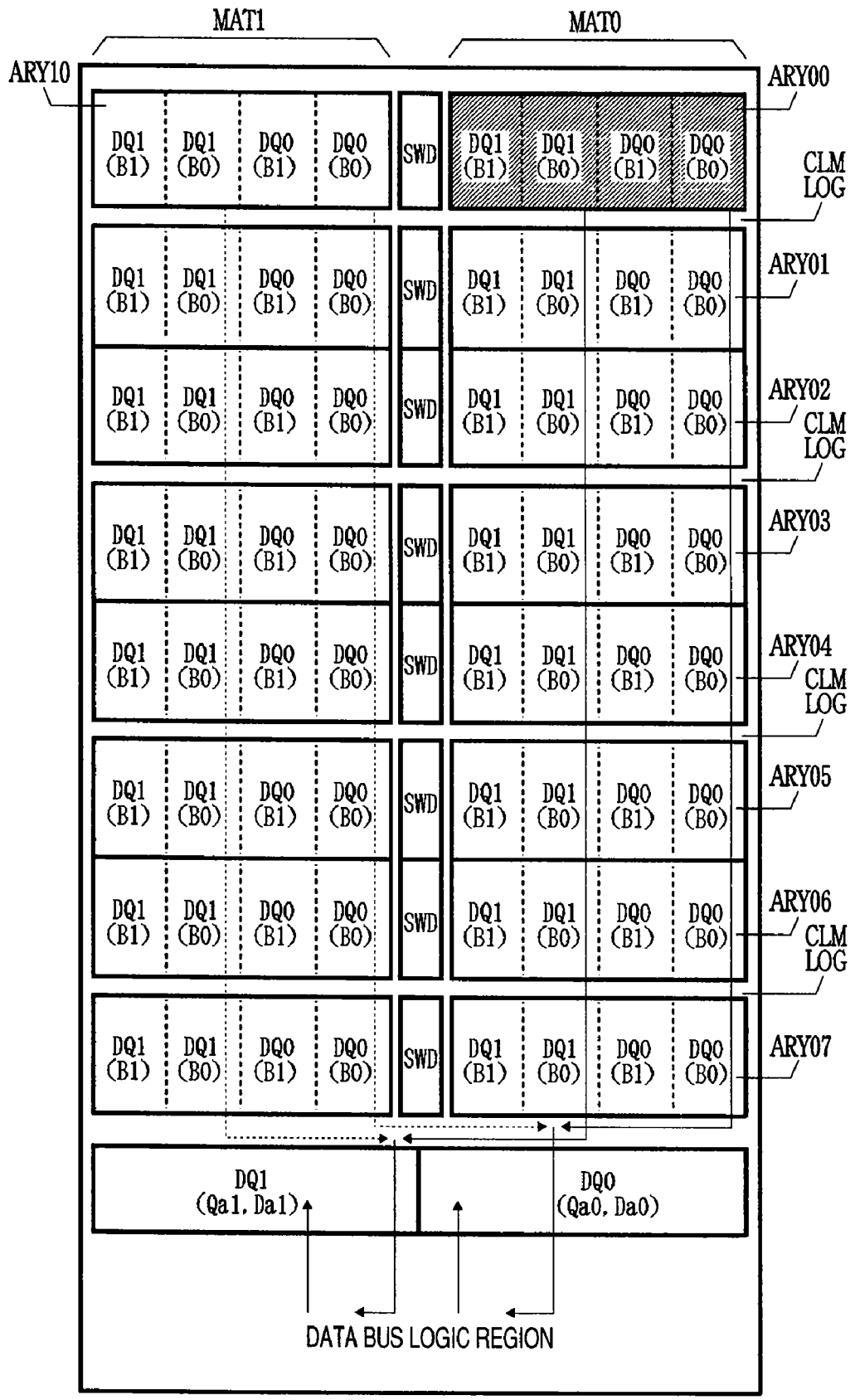
FIG. 3 is an enlarged view illustrating the relationship between input/output circuits DQ00 and DQ01 and memory mats MAT0 and MAT1 in FIG. 2.

FIG. 3 is an enlarged view illustrating the relationship between the input/output circuits DQ00 and DQ01 and the memory mats MAT0 and MAT1 in FIG. 2. Sub-word selection circuits SWD are provided between the memory mats MAT0 and MAT1. The illustrative memory mat MAT0 is divided into eight memory arrays ARY00 to ARY07. A column control circuit CLM and a bus logic section LOG are disposed between the two memory arrays ARY00 and ARY01. The same applies to the other memory arrays (ARY02 and ARY03, ARY04 and ARY05, ARY06 and ARY07). The input/output circuit DQ0 is disposed adjacent to the memory array ARY07.

Figure 4:
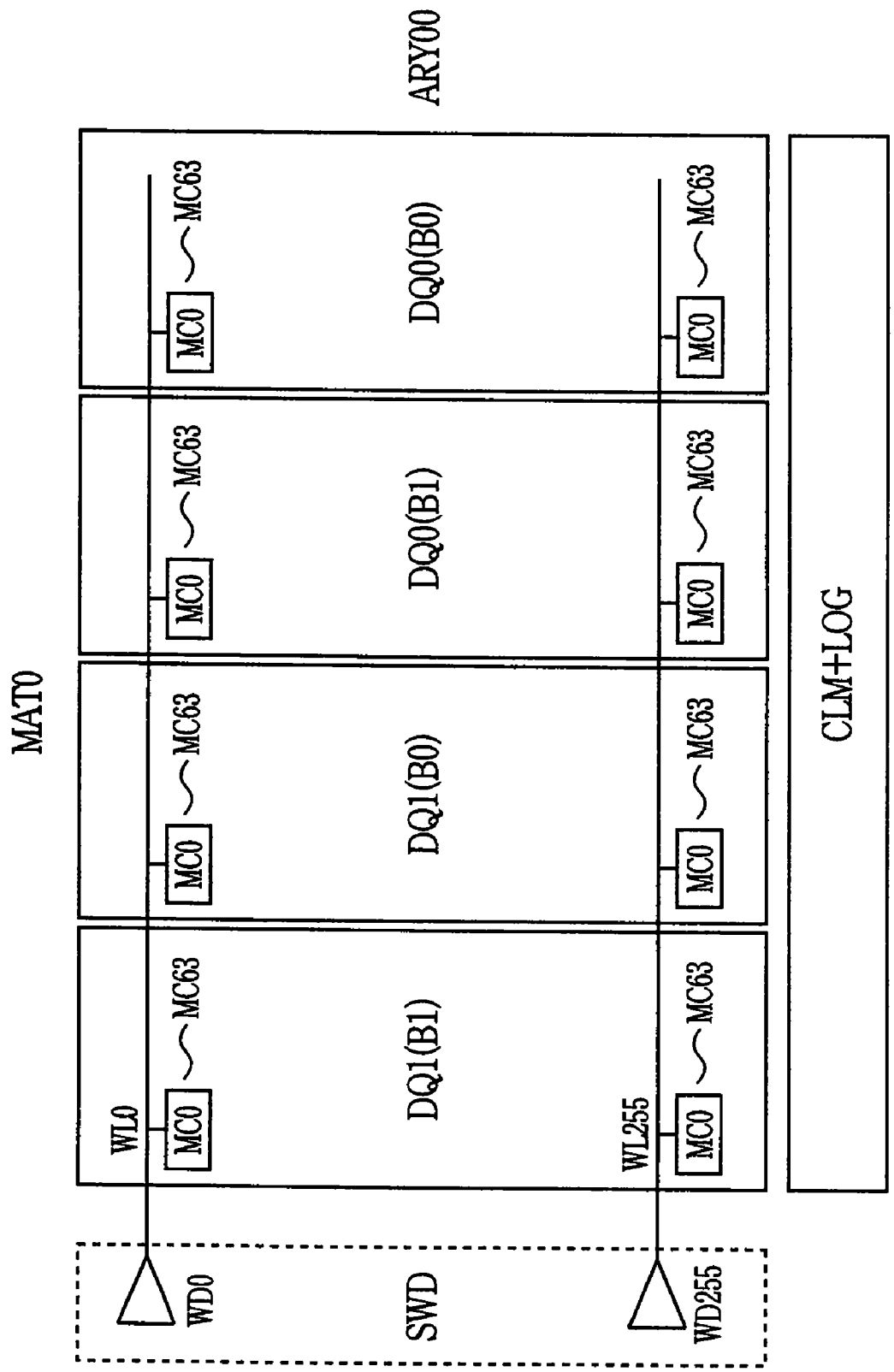
FIG. 4 is a schematic block diagram showing an example of a memory array ARY00 in FIG. 3.

FIG. 4 is a schematic block diagram showing an example of the memory array ARY00 in FIG. 3. The memory array ARY00 is divided into four memory blocks. A word line WL0 (sub-word line) selected by the sub-word selection circuit SWD is provided in common to these memory blocks. That is, the word line WL0 extends through the four memory blocks. In the memory array, there are provided, for example, 256 word lines WL0 to WL255. In accordance therewith, 256 word drivers WD0 to WD255 are provided in the sub-word selection circuit.

In one memory block, 64 memory cells MC0 to MC63 are connected to one word line. The word line WL0 extends through the four memory blocks as described above; therefore, (64×4=) 256 memory cells are connected in all. Addresses such as DQ0(B0), DQ0(B1), DQ1(B0), and DQ1(B1) based on the input/output circuits DQ0 and DQ1 and the burst data (B0) and (B1) are allocated to the memory blocks.

Figure 15:
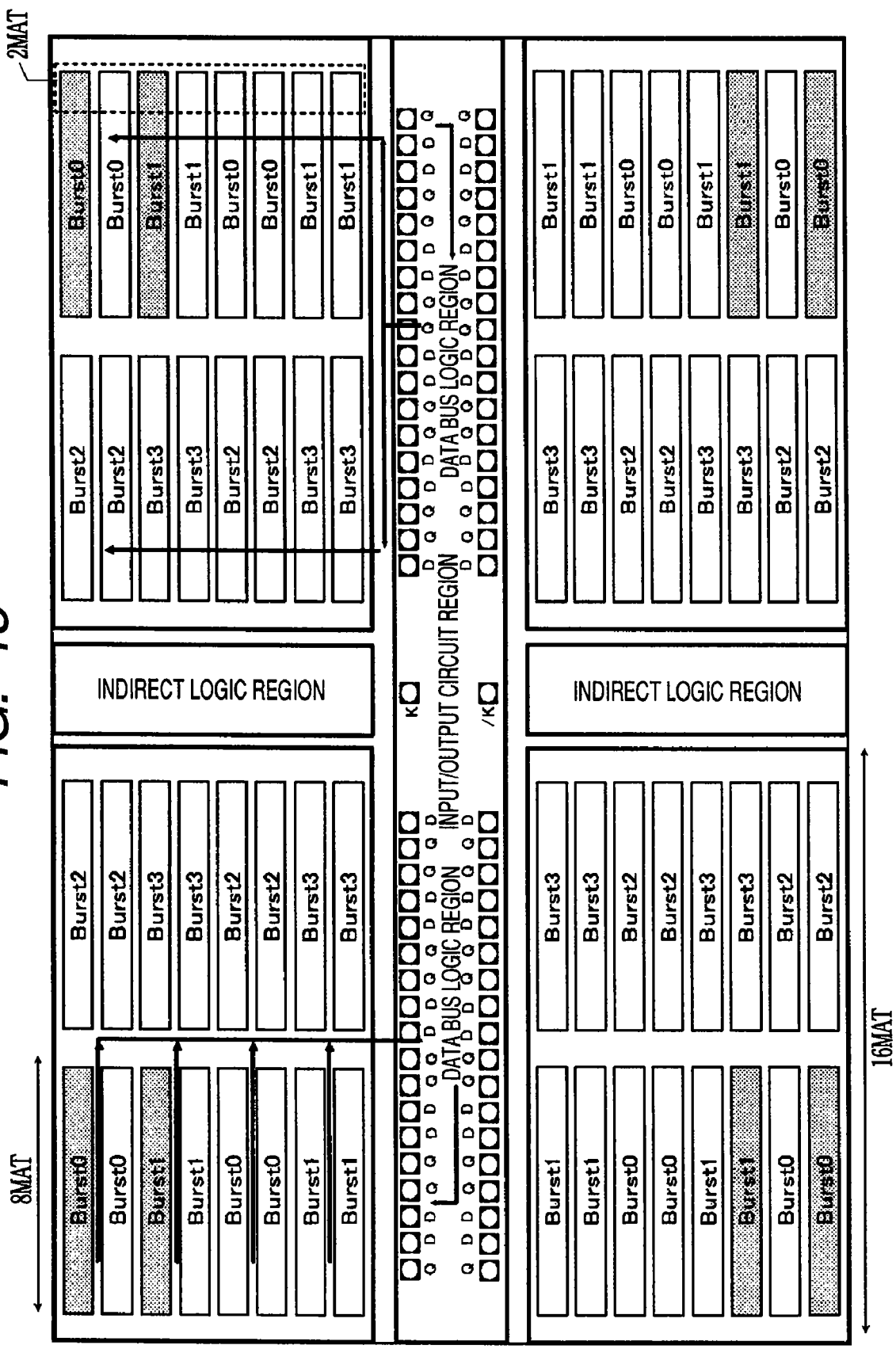
FIG. 15 is an overall block diagram of an SRAM which was studied prior to the invention.

In the case where two pieces of data are processed in one write or read operation in the burst mode, the memory arrays to be selected are shaded in FIGS. 1 and 3. In the one area, 36 bits of data are inputted and outputted corresponding to burst addresses B0 and B1 as described above. Therefore, in the four areas, 36×4 bits are parallel inputted and outputted corresponding to B0 and B1. The number of bits of this SRAM is four times that of the studied SRAM (9×4) shown in FIG. 15.

In this embodiment, the number of I/Os allocated in one mat (one word line) is reduced to two, and memory cells corresponding to different pieces of burst data (B0) and (B1) of the same I/O are configured in one mat (one word line), thus reducing the number of memory cells activated at the same time to suppress a significant increase in current of activated memory cells while increasing the speed of data buses. It is effective for the compatibility between the increasing speed of data buses and the suppression of consumption current that the width of one mat is substantially adapted to the width of a pair of data input/output circuits DQ0 and DQ1 (I/O circuits) and the corresponding I/Os (DQ0 and DQ1) and burst data (B0) and (B1) are allocated to MAT0 and MAT1 with the word drivers SWD in between. Thereby, it becomes possible to reduce the load capacity of data buses while reducing the number of memory cells activated in one access.

According to this embodiment, it is possible to increase the speed of data buses (reduce the amount of delay and a skew) while preventing a significant increase in power consumption by reducing the number of I/Os allocated to one mat. That is, as shown by thin solid lines in FIG. 3, the two read paths from the farthest memory array ARY00 in the memory mat MAT0 corresponding to the input/output circuits DQ0 and DQ1 are indicated by the line paths from DQ0(B0) and DQ1(B0) toward the input/output circuits DQ0 and DQ1 and the line paths, corresponding to approximately two memory blocks, extending along the boundary between the input/output circuits DQ0 and DQ1 and the memory array ARY07. Write paths are provided adjacent to the read paths respectively. In the memory mat MAT1 as well, as shown by dotted lines in FIG. 3, the two read paths from the farthest memory array ARY10 are indicated by the line paths from DQ0(B0) and DQ1(B0) toward the input/output circuits DQ0 and DQ1 and the line paths, corresponding to approximately two memory blocks, extending along the boundary between the input/output circuits DQ0 and DQ1 and the memory array ARY07. Write paths are provided adjacent to the read paths respectively.

In FIG. 1, the address input circuit region which is vertically provided in the horizontal center portion of the chip includes address input circuits, clock input circuits, control input circuits, and terminals (pads) connected thereto. The indirect logic region which is horizontally provided in the vertical center portion of the chip mainly includes address selection circuits. For example, the address selection circuits include word line selection circuits, bit line selection circuits, and sense amplifier/write amplifier selection circuits. The selection circuits are also provided with logic circuits such as decoders and pre-decoders and relay buffers for transmitting timing signals. Word lines are hierarchically composed of a main word line and sub-word lines. A sub-word driver SWD selects a sub-word line (WL0 to WL255). That is, the sub-word driver SWD selects one of the pair of memory mats MAT0 and MAT1, with a selection signal of the main word line and a selection line for selecting one of the plural sub-word lines allocated to the main word line. The same applies to the other memory mats. The adoption of such a hierarchical word line structure enables faster selection of a word line connected to a memory cell to be selected and reduction in consumption current of a non-selected memory cell.

Figure 5:
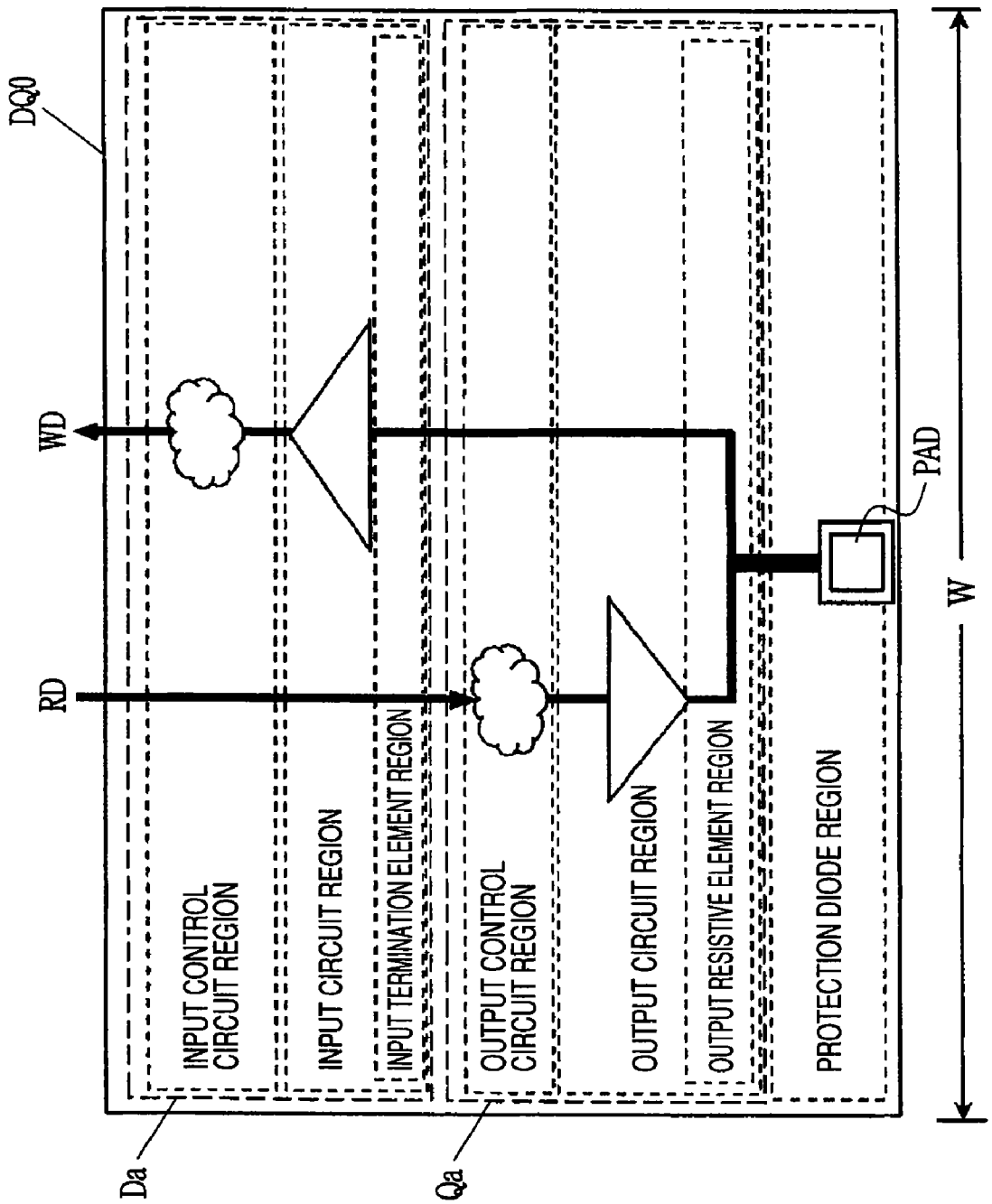
FIG. 5 is a circuit layout diagram showing an example of one input/output circuit.

FIG. 5 is a circuit layout diagram showing an example of one input/output circuit. The input/output circuit DQ0 in FIG. 1 etc. is illustrated by way of example in FIG. 5. In this example, from the memory array side toward the data bus logic region, an input circuit Da, an output circuit Qa, and a protection diode region are disposed in order. The input circuit Da is composed of an input control circuit region, an input circuit region, and an input termination element region. The input termination element region is not necessary in the case of not having a termination resistor for impedance matching. The output circuit Qa is composed of an output control circuit region, an output circuit region, and an output resistive element region. The output resistive element region is not necessary in the case of not performing output resistor control for output impedance control. The protection diode region includes a protection diode and a pad PAD. This example shows a so-called common I/O which have a common input/output terminal. The width of the memory mat MAT0 and the corresponding word driver SWD is adapted to the width W of the common I/O.

Figure 6:
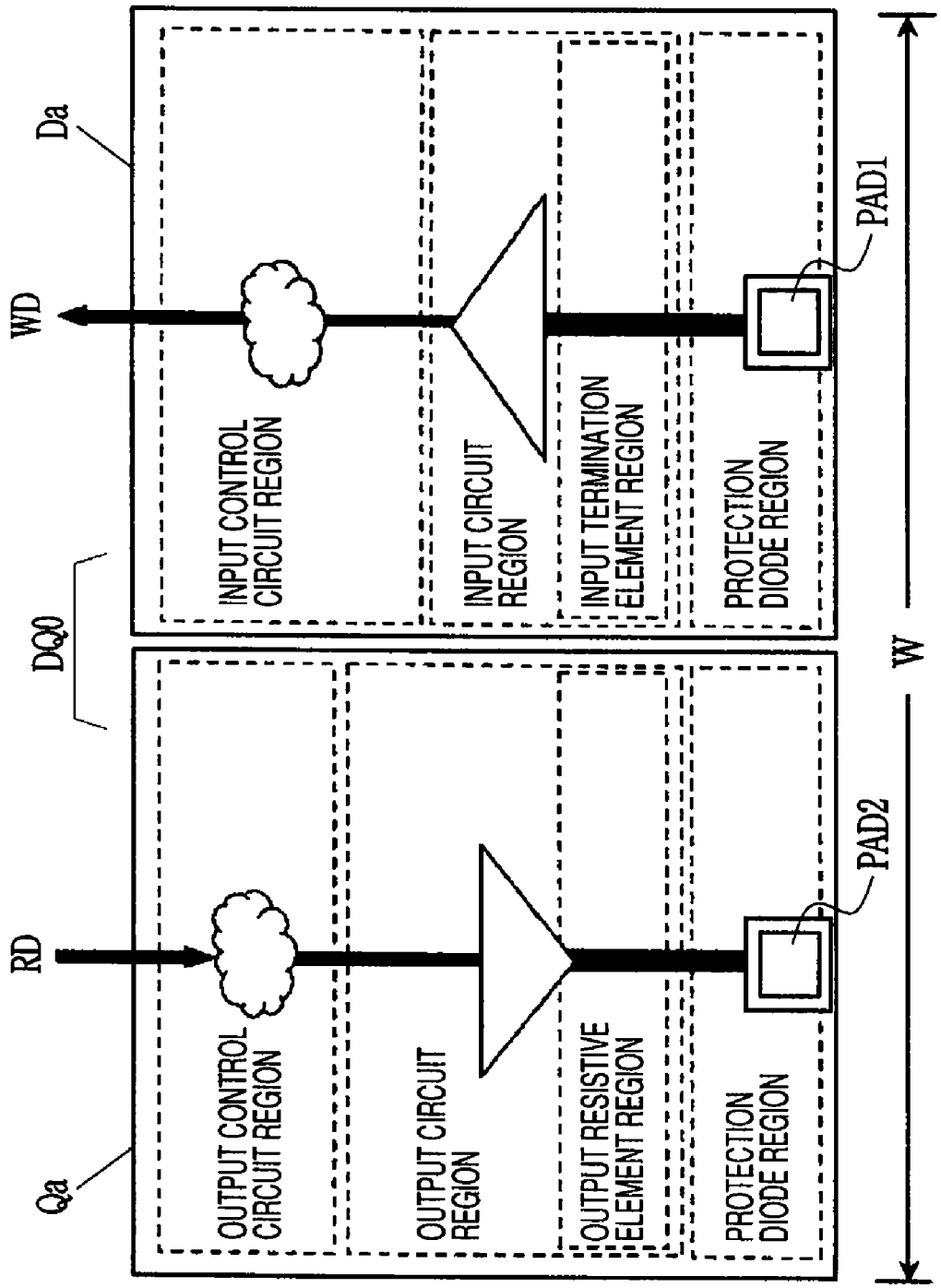
FIG. 6 is a circuit layout diagram showing another example of one input/output circuit.

FIG. 6 is a circuit layout diagram showing another example of one input/output circuit. The input/output circuit DQ0 in FIG. 1 etc. is illustrated by way of example in FIG. 6. This example shows a so-called separate I/O in which an input terminal and an output terminal are separated in the direction of the width W. An input circuit Da provided on either the left or right side is composed of an input control circuit region, an input circuit region, and an input termination element region, from the memory array side toward the data bus logic region. The input termination element region is not necessary in the case of not having a termination resistor for impedance matching. A protection diode region is provided adjacent to the data bus logic region, and an input pad PAD1 is provided in the protection diode region. An output circuit Qa provided on the other side is composed of an output control circuit region, an output circuit region, and an output resistive element region, from the memory array side toward the data bus logic region. The output resistive element region is not necessary in the case of not performing output resistor control for impedance matching. A protection diode region is provided adjacent to the data bus logic region, and an output pad PAD2 is provided in the protection diode region. The width of the memory mat MAT0 and the corresponding word driver SWD is adapted to the width W of the separate I/O.

Figure 7:
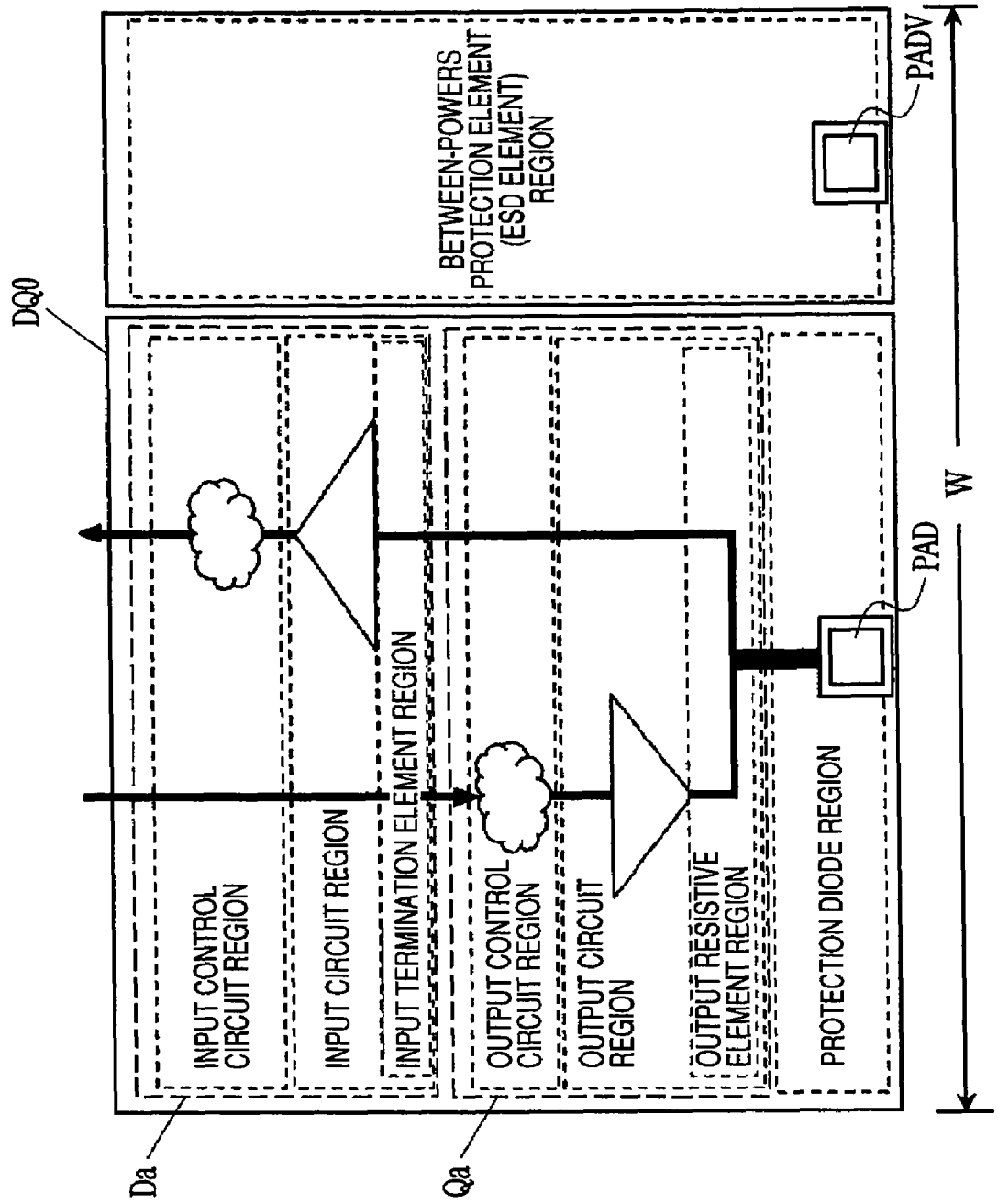
FIG. 7 is a circuit layout diagram showing another example of one input/output circuit.

FIG. 7 is a circuit layout diagram showing another example of one input/output circuit. The input/output circuit shown in FIG. 7 is a modification of that shown in FIG. 5, and is provided with a between-powers protection element region. The between-powers protection element region includes a power pad PADV. The input/output circuit DQa and the between-powers protection element (ESD element) region are disposed so as to fit into the width W of the common I/O. The input/output circuit DQa is the same as that of FIG. 5.

Figure 8:
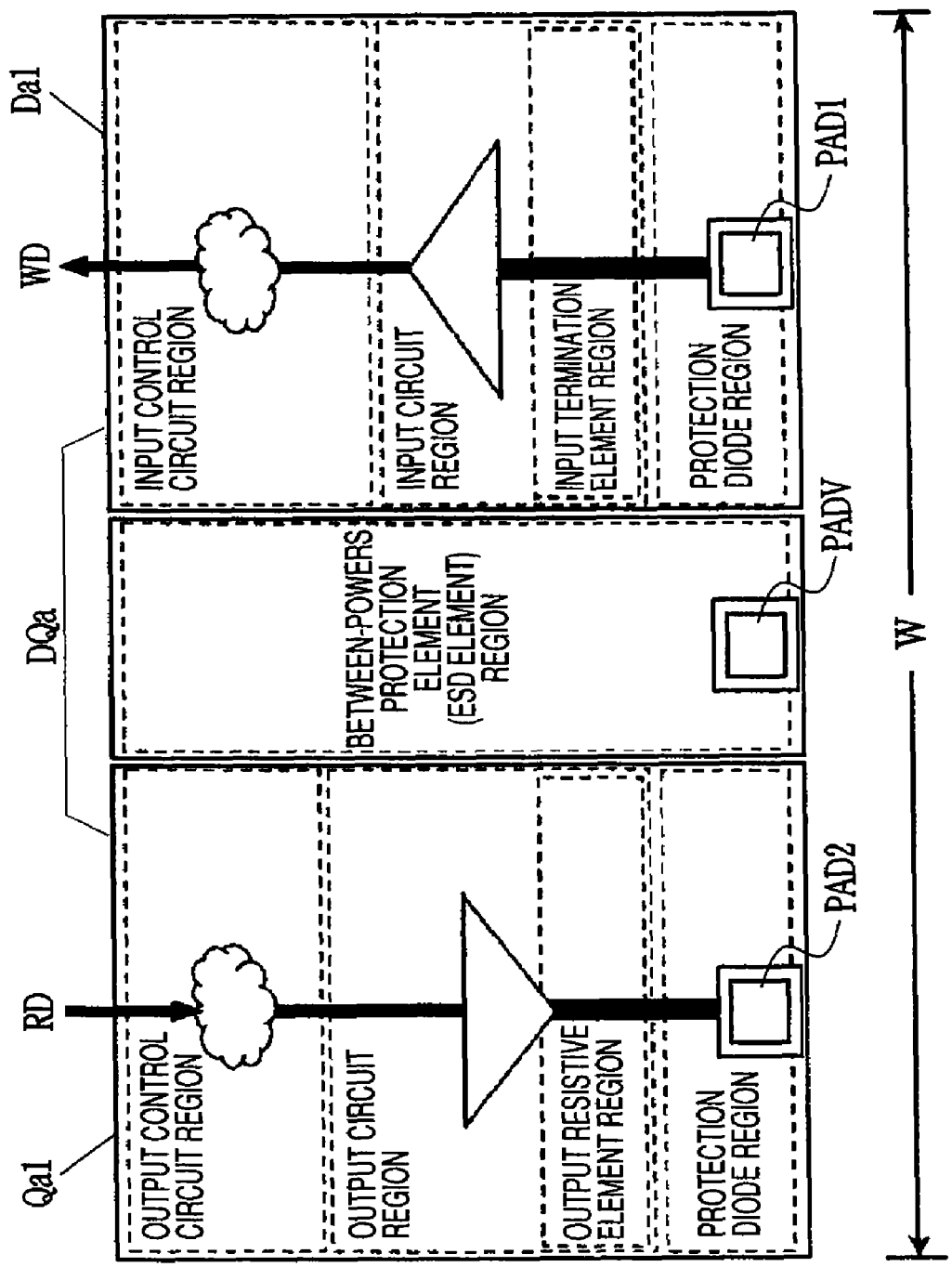
FIG. 8 is a circuit layout diagram showing another example of one input/output circuit.

FIG. 8 is a circuit layout diagram showing another example of one input/output circuit. The input/output circuit shown in FIG. 8 is a modification of that shown in FIG. 6, and is provided with a between-powers protection element region. The between-powers protection element region includes a power pad PADV. The input circuit Da, the between-powers protection element (ESD element) region, and the output circuit Qa are disposed so as to fit into the width W of the separate I/O. In this example, the between-powers protection element (ESD element) region is disposed between the input circuit Da and the output circuit Qa. The other configuration is the same as that of FIG. 6.

Figure 9:
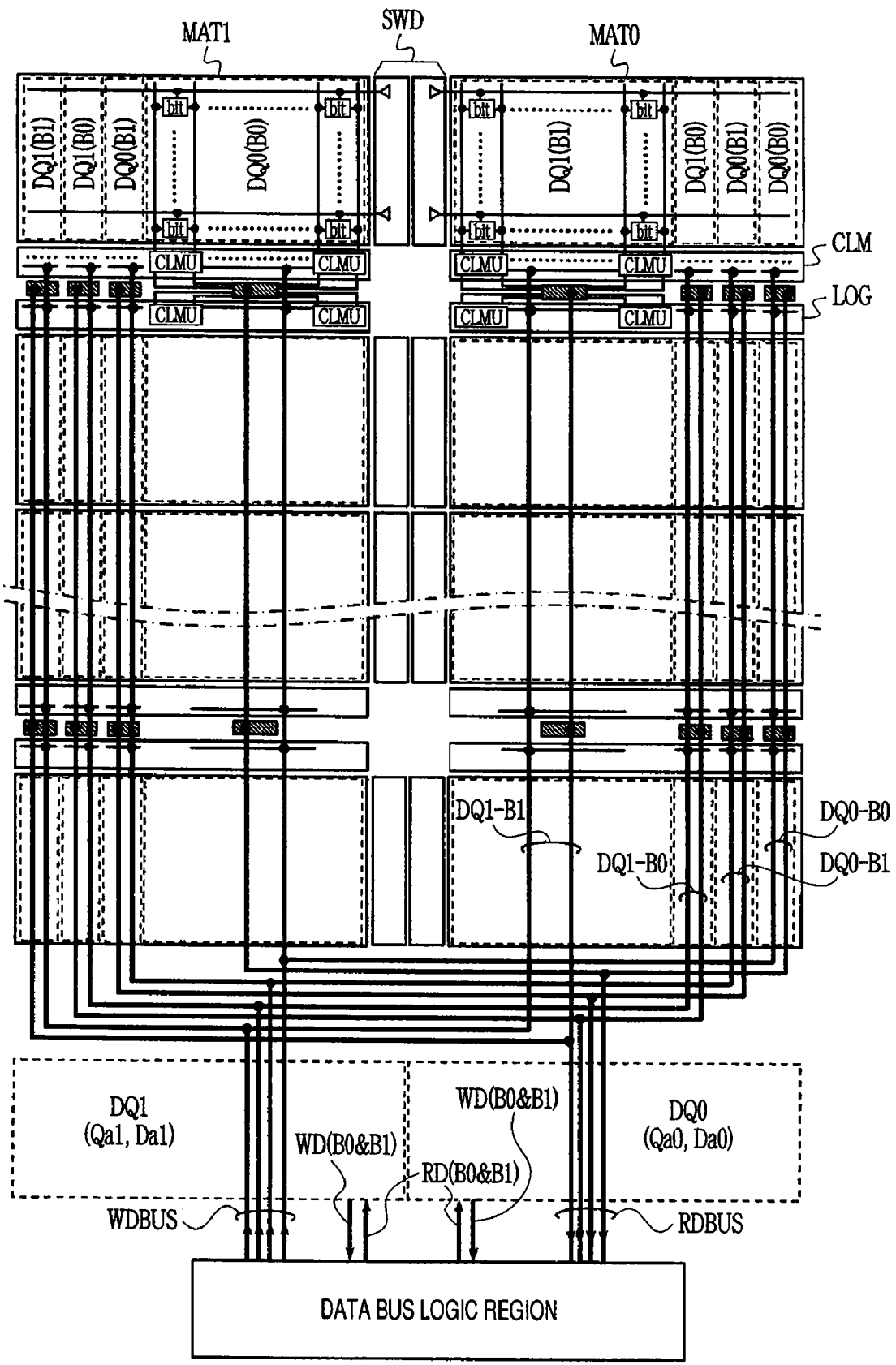
FIG. 9 is a block diagram illustrating the relationship among the input/output circuits, the data bus logic region, and the memory mats in FIG. 3.

FIG. 9 is a block diagram illustrating the relationship among the input/output circuits, the data bus logic region, and the memory mats in FIG. 3. For example, on the memory mat MAT0 side, as described above, eight memory arrays are disposed in the direction in which bit lines extend, and divided into four pairs of memory arrays. The column control circuit CLM and the bus logic section LOG are disposed between two memory arrays. From the bus logic section LOG toward the input/output circuit DQ0, read/write signal buses DQ0-B0, DQ0-B1, DQ1-B0, and DQ1-B1 extend over the memory arrays. The same configuration applies to the memory mat MAT1.

The read signal buses of the two memory mats MAT0 and MAT1 are gathered and routed through the data bus logic region over the input/output circuit DQ0, and connected to the output circuits Qa0 and Qa1 of the input/output circuits DQ0 and DQ1 via signal lines RD (B0&B1). The output terminals of the input circuits Da0 and Da1 of the input/output circuits DQ0 and DQ1 are connected via signal lines WD (B0&B1) and through the data bus logic region to the write signal buses of the two memory mats MAT0 and MAT1. When the memory mat MAT0 is selected, a word line of one memory array out of the eight memory arrays is selected by the sub-word selection circuit SWD and the corresponding column control circuit CLM and bus logic section LOG are activated, so that data is inputted and outputted through the read/write signal buses DQ0-B0, DQ0-B1, DQ1-B0, and DQ1-B1.

Figure 10:
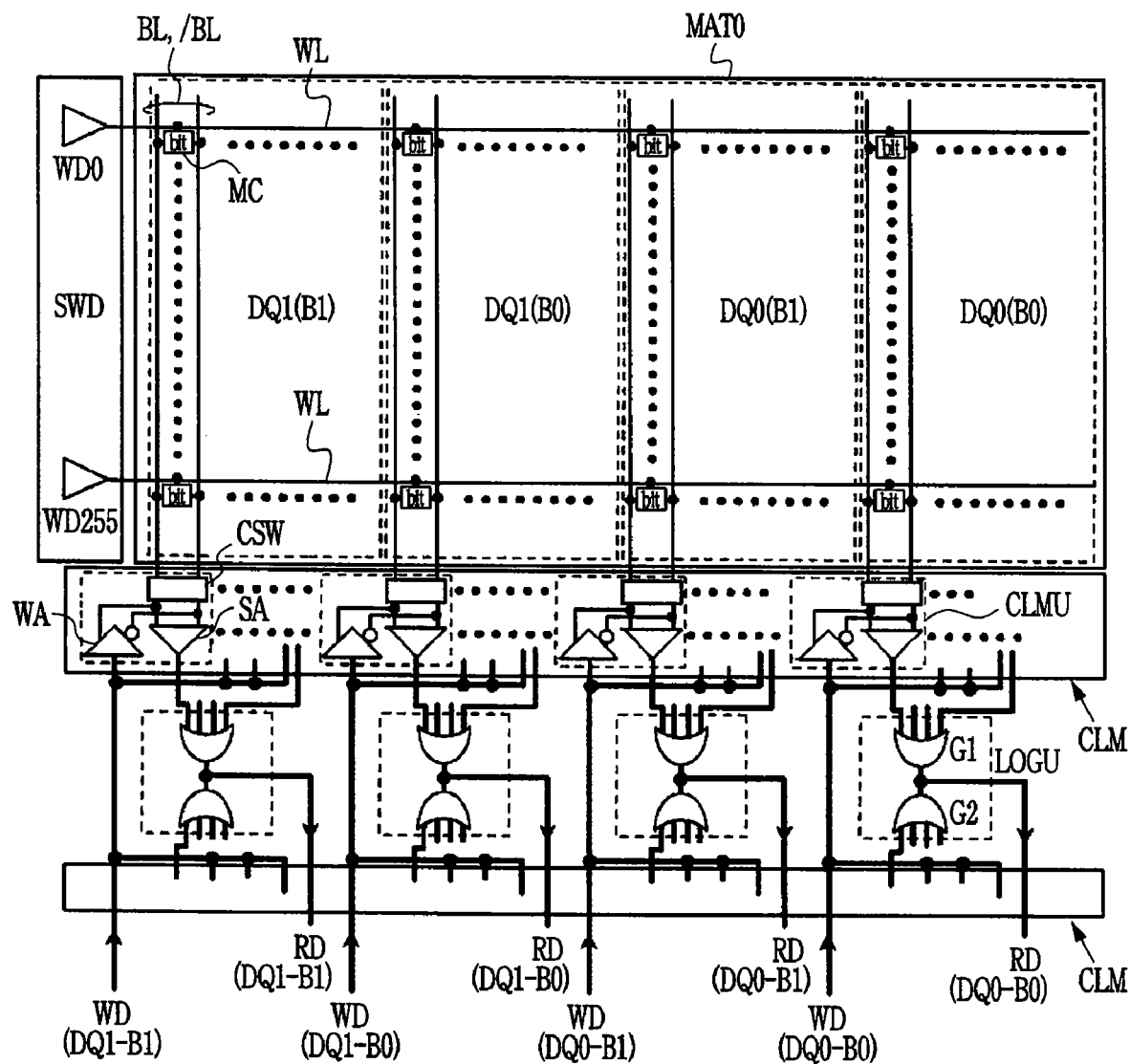
FIG. 10 is a block diagram showing an example of the memory array and the corresponding column control circuit and bus logic section in FIG. 3.

FIG. 10 is a block diagram showing an example of one memory array and the corresponding column control circuit and bus logic section. The column control circuit CLM includes a plurality of unit circuits CLMU each having a column switch CSW, a sense amplifier SA, and a write amplifier WA. Each memory block is provided with a plurality of unit circuits CLMU. Though not limited, one memory block DQ0(B0), DQ0(B1), DQ1(B0), or DQ1(B1) includes 256 word lines and 64 pairs of complementary bit lines as described above. The 64 pairs of complementary bit lines are divided into a plurality of blocks which each have a unit circuit CLMU allocated thereto.

The bus logic section LOG includes a plurality of unit circuits LOGU each having OR circuits such as gate circuits G1 and G2. A read signal of a memory block in a memory array selected through a unit logic circuit LOGU is sent to a read signal bus RD(DQ0-B0) or the like. A write signal bus WD(DQ0-B0) is connected in common to the inputs of write amplifiers WA of unit circuits CLMU. Thus, the read signal from the selected memory array is sent to the read signal bus RD(DQ0-B0) or the like through the column switch CSW, the sense amplifier SA, and the gate circuit G1. The write signal sent to the write signal bus WD(DQ0-B0) or the like is supplied to the inputs of write amplifiers WA of unit circuits CLMU, and the output signal of the write amplifier corresponding to the selected memory array is sent through the column switch CSW to the complementary bit lines and written to the selected memory cell through the word line WL.

Figure 11:
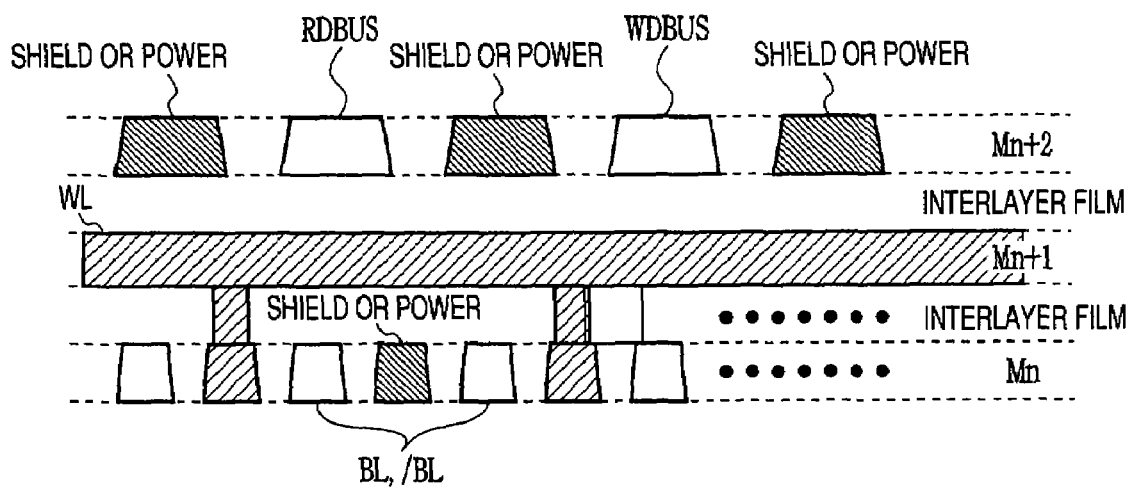
FIG. 11 is a sectional view of assistance in explaining an example of signal buses in FIG. 9.

FIG. 11 is a sectional view of assistance in explaining an example of signal buses in FIG. 9. Complementary bit lines BL and /BL of the memory array are formed of the nth wiring layer Mn. For example, if n is 1, the complementary bit lines are formed of the first wiring layer M1. Though not limited, a shield or power line is provided between the bit lines BL and /BL, thereby preventing mutual coupling via parasitic capacitance.

A word line WL is formed of a wiring layer Mn+1 upper than the complementary bit lines BL and /BL. The word line WL extends in the direction perpendicular to the complementary bit lines BL and /BL. A read bus RDBUS and a write bus WDBUS are formed of a wiring layer Mn+2 upper than the word line WL. The read bus RDBUS and the write bus WDBUS extend in the same direction as the complementary bit lines BL and /BL. Though not limited, a shield or power line is provided between the read bus RDBUS and the write bus WDBUS, thereby preventing mutual coupling via parasitic capacitance. An interlayer film is provided between the wiring layers Mn and Mn+1, and another interlayer film is provided between the wiring layers Mn+1 and Mn+2. The word line WL is connected through a through hole provided in the interlayer film and through the wiring layer Mn to the gate of an address selection MOSFET constituting a memory cell (not shown). The same applies to the complementary bit lines BL and /BL, which are connected to the gate, source, and drain regions of a MOSFET constituting a latch circuit of a memory cell.

Figure 12:
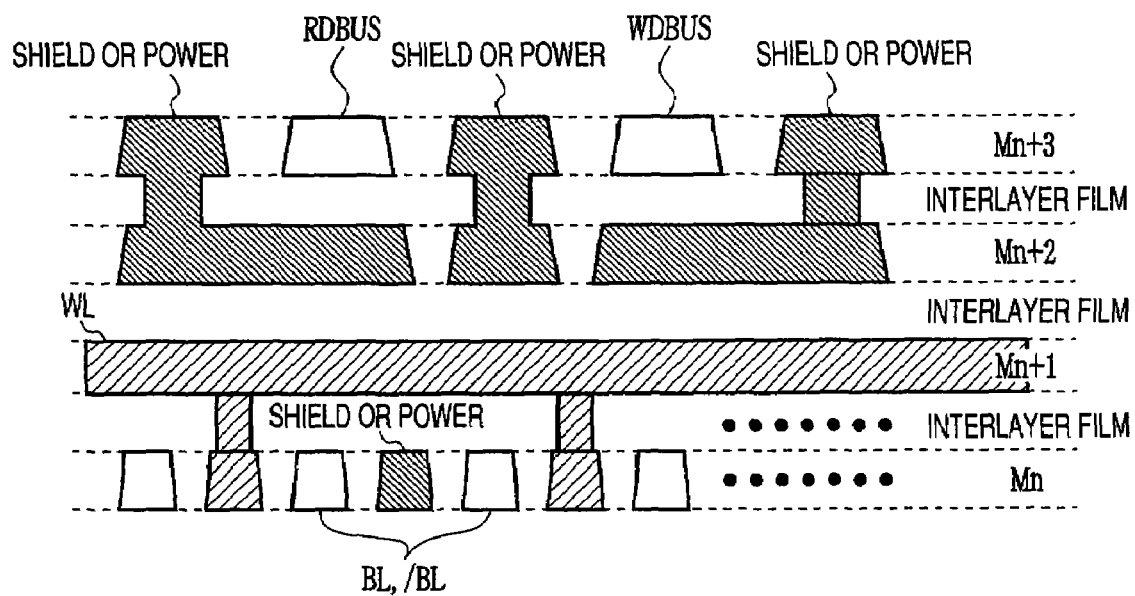
FIG. 12 is a sectional view of assistance in explaining another example of signal buses in FIG. 9.

FIG. 12 is a sectional view of assistance in explaining another example of signal buses in FIG. 9. In this example, a wiring layer Mn+2 upper than a word line WL is used for shielding. A read bus RDBUS and a write bus WDBUS are formed of a wiring layer Mn+3 upper than the shielding wiring layer. A shield or power line is provided between the read bus RDBUS and the write bus WDBUS, and the shielding line of the wiring layer Mn+2 extends under the read bus RDBUS and the write bus WDBUS, thereby preventing mutual coupling between the read bus RDBUS and the write bus WDBUS via parasitic capacitance and also coupling from the word line. The shield wiring may be the same as a power line for supplying power supply voltage or circuit ground voltage. This applies to the example of FIG. 11 as well. The other structures are the same as those shown in FIG. 11.

Figure 13:
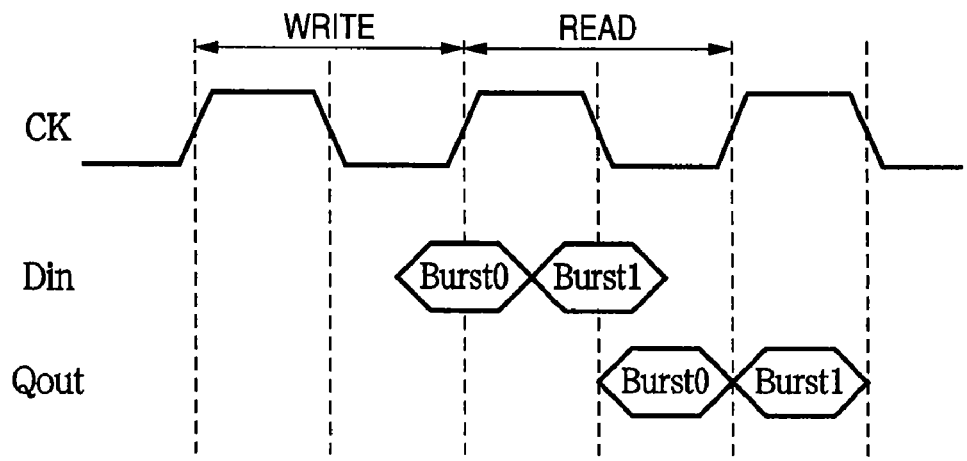
FIG. 13 is an operation waveform diagram showing an example of a DDR SRAM according to the invention.

FIG. 13 is an operation waveform diagram showing an example of a DDR SRAM according to the invention. When a write mode is specified by the input of an address signal and a control signal, input data Burst0-Burst1 corresponding to the memory blocks (B0) and (B1) is captured in synchronization with rising and falling timings of clock CK with a one-clock delay. The input data Burst0-Burst1 is supplied so as to precede the respective timings and ensure the setup time.

When a read mode is specified by the input of an address signal and a control signal, output data Burst0-Burst1 corresponding to the memory blocks (B0) and (B1) is outputted in synchronization with rising and falling timings of clock CK with a delay of one and a half clocks. The read mode can be specified during an input operation in the write mode. The read and write operations allow the latch circuit to hold the address signal. The serial input and output operations are simultaneously available in the case where the input terminal D and the output terminal Q are provided independently as shown in FIGS. 6 and 8. After the above-mentioned data is inputted, the write operation is performed at a time. During the write operation, the necessary data is parallel read and is held in the register. Data is simultaneously inputted and outputted so as not to compete for selection of the memory cells.

Figure 14:
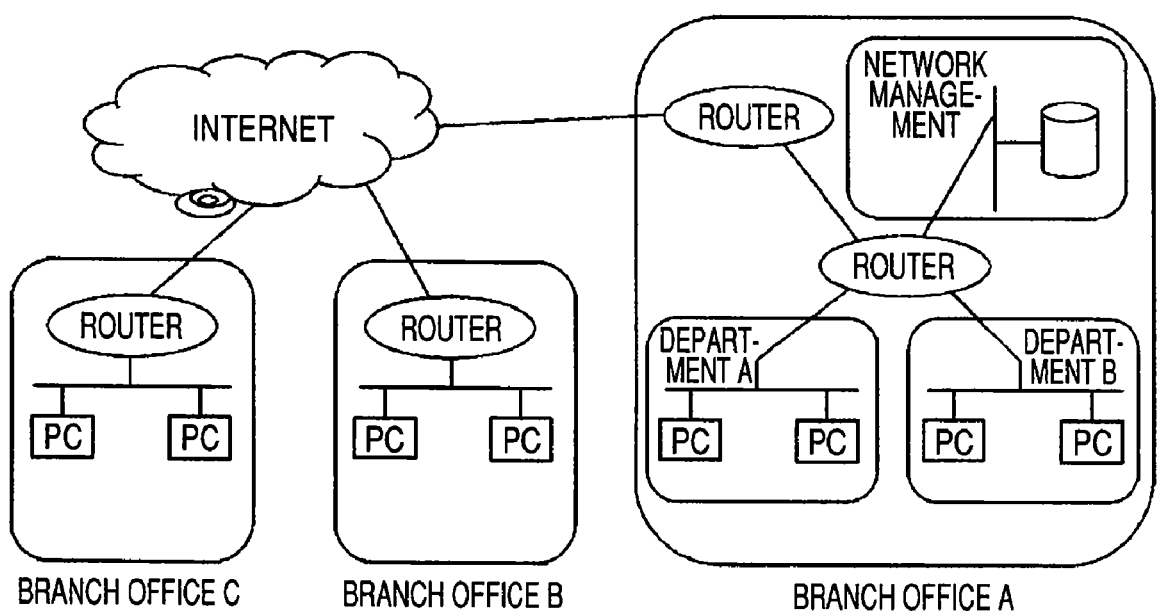
FIG. 14 is a conceptual diagram showing an application of the semiconductor memory device according to the invention.

FIG. 14 is a conceptual diagram showing an application of the semiconductor memory device according to the invention. PC represents a personal computer. In a branch office A, each of departments A and B is provided with PCs that are interconnected via LAN. A router is used to interconnect LANs between the departments in the branch office A. The Internet interconnects branch offices A through C via routers. The DDR SRAM according to the embodiment is mounted on the router and is used as relay memory for transferring data between the PCs.

While there have been described specific preferred embodiments of the present invention, it is to be distinctly understood that the present invention is not limited thereto but may be otherwise variously embodied within the spirit and scope of the invention. For example, in the embodiment, the burst operation of 2 bits has been described; however, the burst operation can be extended up to 4 bits in the same memory mat configuration. In the case of selecting either of the pair of memory mats MAT0 and MAT1, the burst operation of 2 bits can be performed. On the other hand, in the case of selecting both of the memory mats MAT0 and MAT1 simultaneously, the burst operation can be extended up to 4 bits. Various embodiments are available for the construction of the memory mat, the memory block, and the memory cell array. The invention can be widely used for a semiconductor memory device having a burst mode.

What is claimed is:

1. A semiconductor memory device comprising:
   a first input/output circuit and a second input/output circuit which are disposed adjacent to each other in a first direction and include a pad corresponding to an external terminal;
   a first memory mat and a second memory mat which correspond to the first and second input/output circuits and are disposed in a second direction perpendicular to the first direction; and
   a word line selection circuit which is disposed between the first memory mat and the second memory mat, and generates a signal for selecting a word line common to the first memory mat and the second memory mat,
   wherein the first memory mat and the second memory mat each include first to fourth memory blocks having a common word line selected by the word line selection circuit,
   wherein memory cells in the first and second memory blocks can be accessed, including a burst operation, by the first input/output circuit, and
   wherein memory cells in the third and fourth memory blocks can be accessed, including a burst operation, by the second input/output circuit.

2. The semiconductor memory device according to claim 1, wherein memory cell arrays are disposed symmetrically in the second direction so as to interpose a column control circuit including a column switch, a sense amplifier, a write amplifier, and a bus logic section, and wherein a plurality of circuit blocks each including the column control circuit and a pair of memory cell arrays are disposed in the second direction.

3. The semiconductor memory device according to claim 2, wherein, in a memory cell array, a bit line pair extending in the second direction and having a memory cell connected thereto, and a word line extending in the first direction by an upper wiring layer formed through an interlayer film over a wiring layer to which the bit line pair is provided are formed, and wherein a signal line extending in the second direction and connecting the column control circuit to the first and second input/output circuits is formed, by of an upper wiring layer formed through an interlayer film over a wiring layer in which the word line is formed.

4. The semiconductor memory device according to claim 3, wherein the wiring layer includes a read line, and a write line, and wherein a first line which is of the same wiring layer as the read line and the write line, and is supplied with a constant voltage is provided between the read line and the write line.

5. The semiconductor memory device according to claim 4, wherein a second line, a third line, and a fourth line which are supplied with a constant voltage, and constituted by a lower wiring layer formed through an interlayer film are formed under the read line, the write line, and the first line.

6. The semiconductor memory device according to claim 2, wherein a plurality of sets of the first and second input/output circuits and the first and second memory mats are disposed in the first direction, wherein a data bus logic region is provided adjacent to the sets of input/output circuits, and wherein data is parallel written and read by the sets of the first and second input/output circuits.

7. The semiconductor memory device according to claim 6, further comprising an address input circuit region arranged in the first direction, wherein the sets of the first and second input/output circuits, the corresponding memory mats, and the data bus logic region constitute one circuit area, wherein two circuit areas are disposed symmetrically in the second direction such that data bus logic regions in the two circuit areas are adjacent to each other, wherein the two circuit areas are disposed in the second direction symmetrically so as to interpose the address input circuit region.

8. The semiconductor memory device according to claim 7, further comprising an indirect logic region arranged in the second direction, wherein the four circuit areas are disposed in the first direction symmetrically so as to interpose the indirect logic region.

9. The semiconductor memory device according to claim 8, wherein the memory cell is a static memory cell.

10. The semiconductor memory device according to claim 9, wherein the word line selection circuit can select the word line simultaneously in the first memory mat and the second memory mat, and wherein in the burst operation, the first and second input/output circuits can perform serial input/output of 4-bit data obtained 2 bits each from the first memory mat and the second memory mat.

* * * * *